United States Patent [19]
Matsumoto et al.

[11] 3,952,212
[45] Apr. 20, 1976

[54] DRIVER CIRCUIT

[75] Inventors: Raymond T. Matsumoto, Fullerton; Stanley T. Higashi, Anaheim, both of Calif.

[73] Assignee: Rockwell International Corporation, El Segundo, Calif.

[22] Filed: June 5, 1974

[21] Appl. No.: 476,741

[52] U.S. Cl. ............................... 307/243; 307/255
[51] Int. Cl.² ........................................ H03K 17/56
[58] Field of Search ............ 307/243, 246, 255, 262

[56] References Cited
UNITED STATES PATENTS

| | | | |
|---|---|---|---|
| 3,319,086 | 5/1967 | Yee | 307/288 |
| 3,558,919 | 1/1971 | Olk | 307/252 K X |
| 3,573,484 | 4/1971 | Engroff | 307/246 X |
| 3,867,649 | 2/1975 | Cochran | 307/255 X |

FOREIGN PATENTS OR APPLICATIONS

| | | | |
|---|---|---|---|
| 1,206,631 | 9/1970 | United Kingdom | 307/255 |
| 1,588,035 | 5/1970 | Germany | 307/252 K |

*Primary Examiner*—James B. Mullins
*Attorney, Agent, or Firm*—H. Fredrick Hamann; G. Donald Weber, Jr.; Morland Charles Fischer

[57] ABSTRACT

A driver circuit which has low power requirements, a relatively small number of components and provides flexibility in output voltage setting. The driver circuit comprises, essentially, two portions which are selectively activated by the application of input signals. The output signal is determined by which of the two circuit portions is activated. While each of the two circuit portions operates in a manner similar to silicon controlled rectifiers (SCR), the circuit portions are on only when an input signal is supplied thereto.

11 Claims, 3 Drawing Figures

DRIVER CIRCUIT

The invention described herein was made in the performance of work under NASA Contract No. NAS 1-12228 and is subject to the provisions of Section 305 of the National Aeronautics and Space Act of 1958 (72 Stat. 435; 42 U.S.C. 2457).

BACKGROUND OF THE INVENTION

There are many known electronic driver circuits available. However, most of these electronic driver circuits have specific features and functions which are amenable only to the specific application thereof. Some driver circuits are designed to use a minimum number of components without regard for the power drain or the like. Other driver circuits are designed to have a minimum power drain with no limit on complexity or number of components.

Recognizing the advantages now available in integrated circuit structure, driver circuits can be designed with specific attention directed to reducing the power requirements even though the number of components may be increased slightly. That is, somewhat more complex circuits can be integrated into an extremely small area of a semiconductor device. Consequently, low power requirements become more of a controlling factor so long as circuit complexity does not reach excessive proportions.

SUMMARY OF THE INVENTION

The subject invention relates to a driver circuit which has one or more controlling input signals which are supplied to separate circuit portions. Each of the circuit portions comprises one or more semiconductor devices such as transistors. One of the circuit sections may be considered to be a "source section" while the other section may be considered to be a "sink section". In accordance with the signal supplied, one or the other of the circuit sections is operative and controls the total current supplied to a common output terminal.

The driver circuit exhibits relatively rapid switching while requiring relatively low holding or maintaining current. The circuit exhibits very low power requirements, especially inasmuch as the input signal, rather than the driver circuit, supplies the holding current.

The basic driver circuit can be implemented in several embodiments in order to obtain additional output signals with variations on the input signal requirement.

DESCRIPTION OF PREFERRED EMBODIMENT

Figure 1:
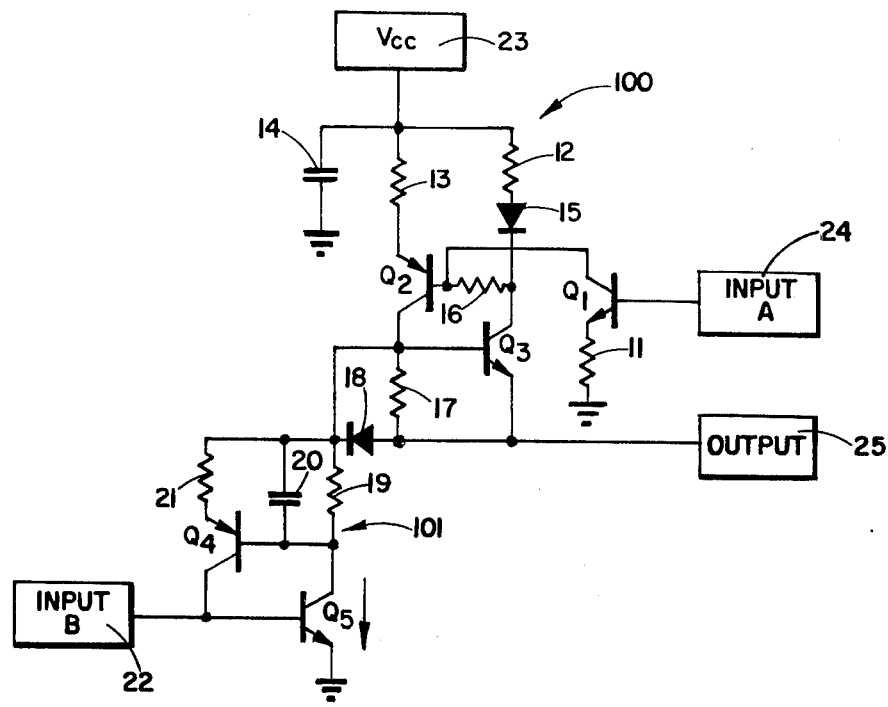
FIG. 1 is a schematic diagram of one embodiment of the instant invention.
Figure 2:
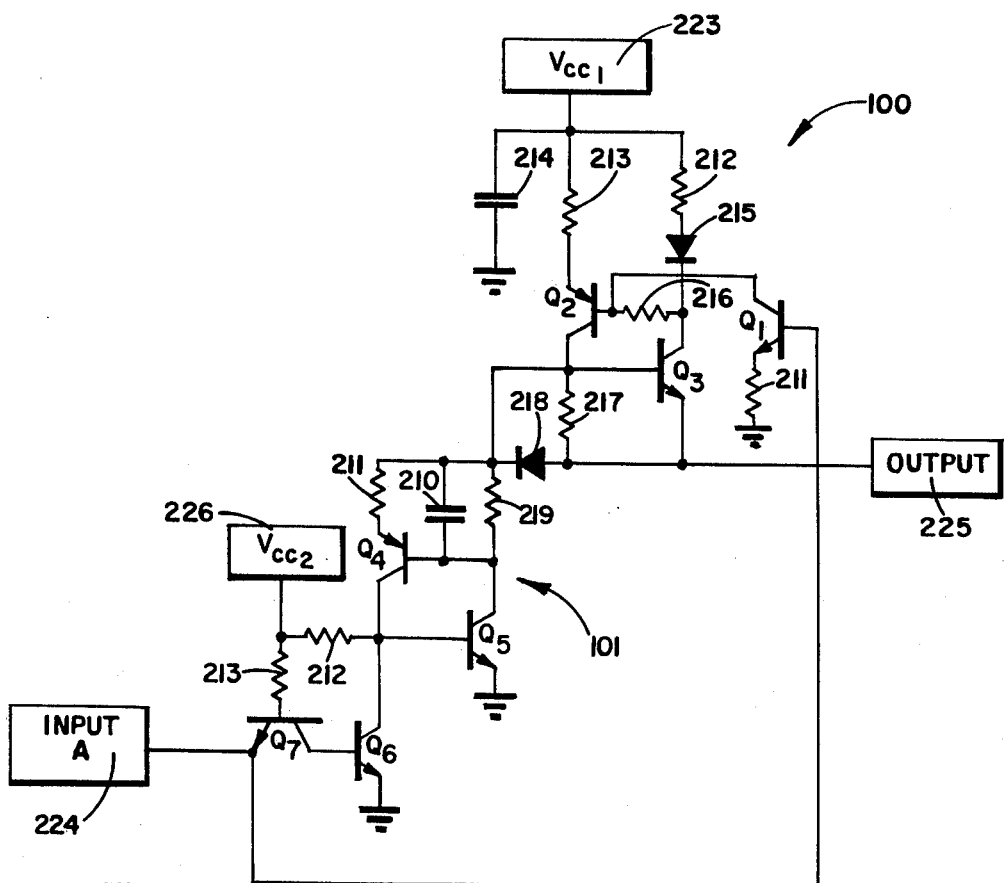
FIG. 2 is a second embodiment of the instant invention wherein a single input source is utilized.

Referring now to FIG. 1, there is shown a schematic diagram of one embodiment of the invention. This circuit may be referred to as the basic circuit which can be modified as shown in the embodiments of FIGS. 1 and 2 and includes circuit portions 100 and 101. Circuit portion 100 is the source section while circuit portion 101 is the sink section.

In FIG. 1, there are shown two separate input sources 22 and 24 and a single output device 25. Sources 22 and 24 may be any suitable type of electrically switchable sources. Typically, in the instant embodiment, input sources 22 and 24 produce signals which selectively switch between positive and negative voltage levels. In general, these voltage levels are relative but, for purposes of explanation, are considered to be positive and negative voltages.

Input source 24 (which supplies input signal A) is connected to the base electrode of transistor Q1. Transistor Q1 is shown as an NPN type transistor with the emitter electrode thereof connected to ground or other reference potential by resistor 11. The collector electrode of transistor Q1 is connected to the base electrode of transistor Q2. Transistor Q2 is shown as a PNP type transistor which has the emitter electrode thereof connected to source 23 by resistor 13. Source 23 is a suitable source for supplying appropriate voltages and currents to the circuit. The collector electrode of transistor Q2 is connected to the base electrode of transistor Q3. Transistor Q3 is shown as an NPN type transistor. The collector electrode of transistor Q3 is returned to the base of transistor Q2 via resistor 16. The emitter electrode of transistor Q3 is connected to output device 25.

Source 23 is also connected to the collector electrode of transistor Q3 via the series circuit comprising resistor 12 and diode 15 which controls the direction of current through transistor Q3. In particular, the cathode of diode 15 is connected to the collector of transistor Q3. Source 23 is connected to ground or other suitable reference potential via filter capacitor 14.

Resistor 17 is connected between the base and emitter electrodes of transistor Q3. The emitter electrode of transistor Q3 is also connected to the anode of diode 18, the cathode of which is returned to the base of transistor Q3.

Input source 22 is connected to the base electrode of transistor Q5 and the collector electrode of transistor Q4. The emitter of NPN transistor Q5 is connected to ground or other suitable potential source. The collector electrode of transistor Q5 is connected to the base of transistor Q4 and to the cathode of diode 18 via resistor 19. The emitter electrode of PNP transistor Q4 is connected via resistor 21 to the cathode of diode 18 which is also connected to the base electrode of transistor Q4 via capacitor 20.

In discussing the operation of the circuit, it is initially considered that the circuit is in the off condition. Under these conditions, the signals supplied by input sources 22 and 24 are each of a relatively negative or ground potential.

If now, it is considered that the signal supplied by source 24 switches to a positive level while the signal supplied by source 22 remains at ground, transistor Q5 remains off while transistor Q1 is rendered conductive. When transistor Q1 is conductive, a current path exists from source 23 to ground via the collector-emitter path of transistor Q1. Conduction by transistor Q1 effectively lowers the voltage at the base electrode of transistor Q2 wherein transistor Q2 is rendered conductive. When transistor Q2 is rendered conductive, the base electrode of transistor Q3 is effectively connected to source 23 whereby transistor Q3 is rendered conductive as well. Thus, there exists from source 23 to output device 25 current paths through transistors Q3 and Q2. The currents are summed and supplied to output device 25. No current flows through transistors Q4 or Q5 inasmuch as transistor Q5 is maintained non-conductive by the input signal supplied thereto.

Considering now the condition wherein the signal supplied by source 22 becomes positive and the signal supplied by source 24 becomes negative, transistor Q1 is rendered non-conductive while transistor Q5 becomes conductive. When transistor Q5 is conductive, transistor Q4 is biased conductive whereby transistor Q5 is effectively latched in the conductive condition and a current path exists, from output device 25 to ground. Thus, this circuit operation has the effect of "sinking" current from output device 25. Furthermore, conduction by transistor Q5 tends to bias transistor Q3 in the off condition. Thus, the circuit tends to stabilize in either condition, as determined by the input signal supplied thereto. That is, either circuit portion 100 and 101 is operative. Moreover, the respective operations of the circuits tends to effectively render one circuit portion conductive while driving the other circuit portion non-conductive. Thus, more rapid switching from one condition to the other is implemented.

Incidentally, it is conceivable that both input sources 24 and 22 may supply relatively positive input signals concurrently. In this case, each of the circuit portions 100 and 101 will be rendered operative in the respective manners described supra. Thus, circuit portions 100 and 101 will tend to supply current to output device 25, while circuit portion 101 will simultaneously tend to sink current from output device 25. Typically, this condition will result in a somewhat indeterminate circuit operation and is undesirable. However, the circuit will not "latch" in this condition. In fact, the last remaining input signal (when one input signal is terminated) will control the circuit operation. This kind of operation has an advantage in that precise tolerances are not required in the application of input signals to this circuit.

Of course, if this type of operation is completely undesirable or causes power requirements which are intolerable, the circuit modification shown in FIG. 2 can be utilized.

Referring now to FIG. 2, there is shown a schematic diagram of a circuit which is similar to the circuit shown in FIG. 1. Components in the circuit of FIG. 2 which are similar to the components of the circuit of FIG. 1 bear similar reference numerals with the addition of prefix 2. For example, source 223 in FIG. 2 is equivalent to source 23 in FIG. 1.

Comparison of the schematic diagrams will indicate the similarity therebetween. However, the circuit shown in FIG. 2 is modified to require only a single input source 224. This modification includes source 226 which is connected via resistor 212 to the common junction between the base electrode of transistor Q5 and the collector electrode of transistor Q4. This common junction was previously connected to input source 22. In addition, the aforementioned common junction is connected to a reference potential via NPN transistor Q6. In particular, the emitter electrode of transistor Q6 is connected to ground or other suitable reference potential.

The base electrode of transistor Q6 is connected to the collector electrode of NPN transistor Q7. The base electrode of transistor Q7 is connected via resistor 213 to source 226. The emitter electrode of transistor Q7, as well as the base electrode of transistor Q1, is connected to input source 224.

In operation, the circuit in FIG. 2 operates substantially similarly to the circuit shown in FIG. 1. However, transistors Q6 and Q7 operate to effectively invert the signal produced by source 224 which is applied to the base electrode of transistor Q5 relative to the signal applied to the base of transistor Q1. That is, source 226 is considered to be a relatively positive source. Consequently, the base electrode of transistor Q5 is effectively connected to a positive source and transistor Q5 is conductive when the signal supplied by input source 224 is relatively negative. Transistor Q6 is rendered non-conductive by these signal conditions. Concurrently, the relatively negative input signal from source 224 is supplied directly to the base electrode of transistor Q1 wherein this latter transistor is rendered non-conductive.

However, when the signal supplied by source 224 switches and becomes relatively positive, the base of transistor Q1 is effectively switched positive wherein this transistor becomes conductive. Likewise, the base electrode of transistor Q6 receives the positive input signal from source 224 via transistor Q7. When transistor Q6 is rendered conductive, the base electrode of transistor Q5 is effectively clamped to ground via transistor Q6. Consequently, transistor Q5 is then rendered non-conductive.

Clearly, with the insertion of the inverter network comprising transistors Q6 and Q7, resistors 212 and 213 and source 226, a single alternating input signal source 224 can be utilized to control the operation of the circuit.

Once the signals supplied by source 224 effectively control the operation of transistors Q1 and Q5, the remainder of the circuit operation is similar to that of the circuit operation described supra relative to FIG. 1. A detailed redescription of this operation is deemed unnecessary at this time.

Figure 3:
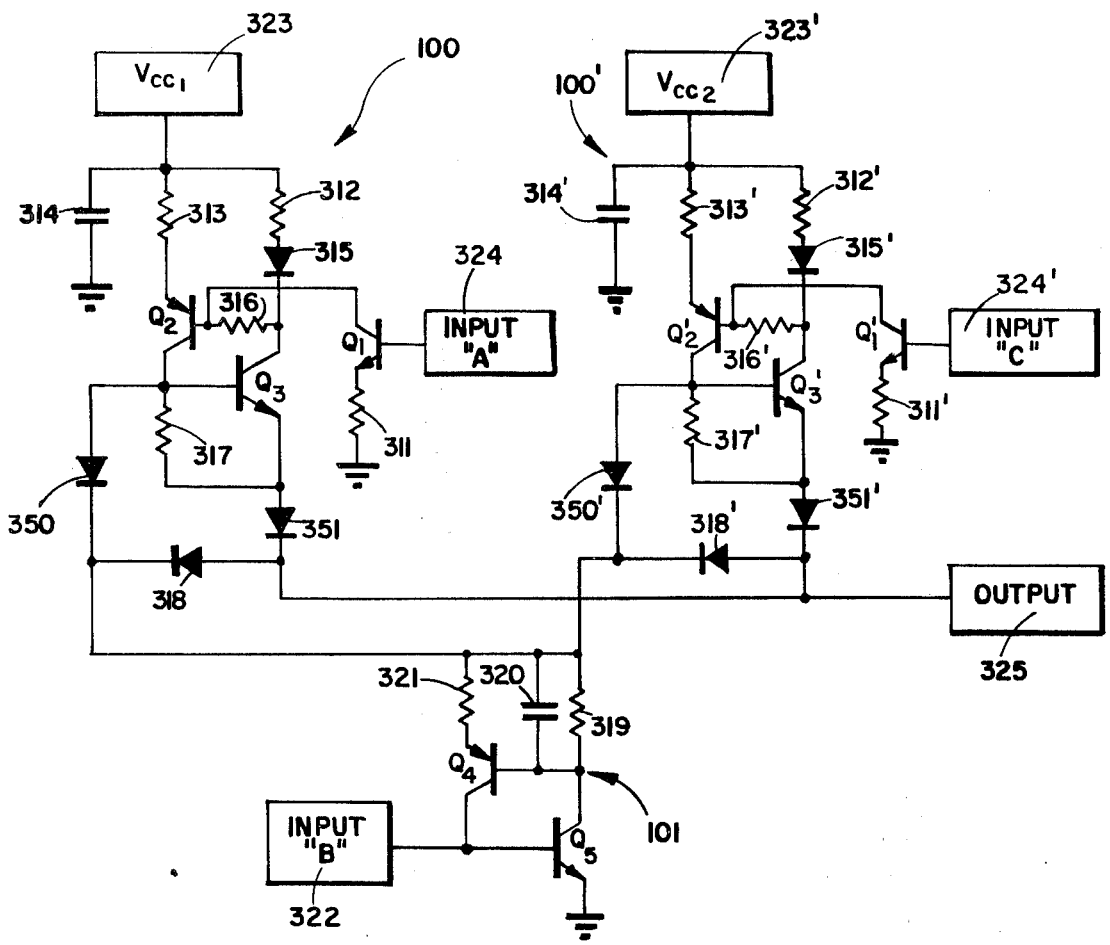
FIG. 3 is a further embodiment of the instant invention wherein additional sources and inputs are provided in order to permit a plurality of output signal levels.

Referring now to FIG. 3, there is shown a schematic diagram of another embodiment of the instant invention wherein the circuit produces a plurality of output signal levels. The circuit shown in FIG. 3 is substantially similar to the circuits shown in FIGS. 1 and 2. The similar components bear similar reference numerals with the prefix 3. For example, source 23 in FIG. 1 is equivalent to source 323 (or source 323') in FIG. 3. In addition, inasmuch as two substantially similar circuit portions 100 and 100' are shown in FIG. 3, similar components in the separate circuit portions bear the same reference numerals with one circuit portion being primed.

In the circuit shown in FIG. 3, sources 323 and 323' may be designed to provide different voltage levels. For example, source 323 may produce a voltage of approximately 100 volts while source 323' may produce a signal of 50 volts.

Depending upon the application of input signal A from source 324, input signal B from source 322, or input signal C from source 324', circuit portions 100, 100' or 101 are effectively rendered conductive. As indicated in the description of the operation relative to the circuit shown in FIG. 1, application of input signal A by source 324 will render circuit portion 100 conductive wherein the signal $VCC_1$ (supplied by source 323) is applied to output device 325 via circuit path comprising resistor 312, diode 315, transistor Q3 and diode 351.

Similarly, application of input signal C (supplied by source 324') will cause the signal $VCC_2$ to be supplied from source 323' to output device 325.

In the alternative, application of input signal B by source 322 will render circuit portion 101 conductive wherein output device 325 is connected to ground. Diodes 318 and 318' function in the manner of diode 18 described relative to FIG. 1. Diodes 351 and 351' serve to decouple circuit portions 100 and 100' when one or the other thereof is operative. Likewise, diodes 350 and 350' also serve to decouple circuit portions 100 and 100' when one or the other thereof is operative.

That is, if a relatively positive output signal is supplied by circuit portion 100 to output device 325, this positive signal cannot be supplied to the emitter electrode of transistor Q3' because of diode 351'. In addition, the relatively positive output signal is isolated from the base electrode of transistor Q3' by means of diode 350'. The similar operation is effected by diodes 350 and 351 relative to a relatively positive signal produced by circuit portion 100'.

Thus, there is shown and described a circuit which may be used in many driver applications. For example, this type circuit may be used in an X-Y matrix driver and is especially adaptable to liquid crystal display devices. The driver circuit can be used as a voltage driver where low power, high speed switching is desired. Similarly, the circuit provides a minimum complexity type of circuit with independence from beta and power supply variations which is highly desirable in many circuit applications.

The circuits shown and described are illustrative only and represent preferred embodiments of the instant invention. Those skilled in the art will recognize that certain modifications may be made to the circuits. However, any such modifications which fall within the purview of this description are intended to be included therein. The scope of the invention is determined only by the claims appended hereto.

Having thus claimed and described the preferred embodiments of the instant invention, what is claimed is:

1. A circuit comprising:
   input means for supplying first and second voltage level signals,
   output means,
   source means for supplying a plurality of reference potentials,
   first circuit means including first and second semiconductor devices having the respective conduction paths thereof connected between said source means and said output means in order to selectively supply a first of said plurality of reference potentials to said output means, and
   second circuit means including third and fourth semiconductor devices, said third semiconductor device having a conduction path connected from said output means to said source means and a second of said plurality of reference potentials, said fourth semiconductor device having a conduction path thereof connected between said output means and said source means in order to selectively supply a third of said plurality of reference potentials to said output means, said fourth device further connected to said third device to selectively control the conduction of said third device,
   said input means connected to said first circuit means and to said second circuit means and adapted to selectively render said first circuit means conductive when said input means supplies said first voltage level signal thereto and said second circuit means conductive when said input means supplies said second voltage level signal thereto,
   said first circuit means selectively rendered conductive to form a current path from said source means to said output means via the conduction paths of said first and second semiconductor devices to thereby charge said output means with a potential substantially equal to that of said first reference potential,
   said second circuit means selectively rendered conductive to form a current path from said output means to said source means via the conduction path of said fourth semiconductor device to thereby substantially discharge said output means to said third reference potential.

2. The circuit recited in claim 1, wherein said first and second semiconductor devices are interconnected to be normally non-conductive,
   said input means connected to one of said first and second semiconductor devices to selectively cause conduction thereof when said input means supplies said first voltage level signal, so that each of said first and second semiconductor devices becomes conductive and latches in the conductive condition.

3. The circuit recited in claim 1 wherein said first and second semiconductor devices are of different conductivity types.

4. The circuit recited in claim 1, wherein said third and fourth semiconductor devices are interconnected to be normally non-conductive,
   said input means connected to said third and fourth semiconductor devices to selectively cause conduction thereof when said input means supplies said second voltage level signal, so that said third and fourth semiconductor devices become conductive and latch in the conductive condition.

5. The circuit recited in claim 1 wherein said input means includes separate input sources connected to each of said first and second circuit means to control the operation thereof independently.

6. The circuit recited in claim 1 including inverter means connected between said input means and one of said first and second circuit means whereby said first and second circuit means receive mutually different input signals.

7. The circuit recited in claim 6, wherein said inverter means includes fifth and sixth semiconductor devices,
   the conduction path of said fifth semiconductor device connected between a control electrode of said fourth semiconductor device and said source means in order to supply said third of said plurality of reference potentials to said control electrode, whereby the voltage level of a signal received at said control electrode of said fourth device is different from the voltage level of a corresponding signal supplied by said input means to said first circuit means, and
   the conduction path of said sixth device connected between said input means and said fifth device to control the operation of said fifth device.

8. The circuit recited in claim 1, wherein said input means is connected to a control electrode of said first and fourth semiconductor devices respectively.

9. A driver circuit comprising:

first and second input means, each supplying first and second voltage level signals, output means, source means for supplying a plurality of reference potentials, first circuit means including first and second semiconductor devices having respective conduction paths thereof connected between said source means and said output means in order to selectively supply a first of said plurality of reference potentials to said output means, and second circuit means including third and fourth semiconductor devices, said third semiconductor device having a respective conduction path thereof connected between said output means and said fourth semiconductor device, said fourth semiconductor device having a conduction path thereof connected between said output means and said source means in order to supply a second of said plurality of reference potentials to said output means, said fourth semiconductor device further connected to a control electrode of said third semiconductor device to selectively control conduction of said third device, said first input means connected to said first circuit means and adapted to selectively render said first circuit means conductive when said first input means supplies said first voltage level signal thereto, said second input means connected to said second circuit means and adapted to selectively render said second circuit means conductive when said second input means supplies said second voltage level signal thereto, said first circuit means selectively rendered conductive to form a current path from said source means to said output means via the conduction paths of said first and second semiconductor devices to thereby charge said output means with a potential substantially equal to that of said first reference potential, said second current means selectively rendered conductive to form a current path from said output means to said source means via the conduction path of said fourth semiconductor device to thereby substantially discharge said output means to said second reference potential.

10. The driver circuit recited in claim 9, wherein said first and second semiconductor devices are interconnected to be normally non-conductive, said first input means connected to one of said first and second semiconductor devices to selectively cause conduction thereof when said first input means supplies said first voltage level signal thereto, whereby each of said first and second semiconductor devices becomes conductive and latches in the conductive condition, said third and fourth semiconductor devices interconnected to be normally non-conductive, said second input means connected to a control electrode of said fourth semiconductor device to selectively cause conduction thereof when said second input means supplies said first voltage level signal thereto, whereby each of said third and fourth semiconductor devices becomes conductive and latches in the conductive condition.

11. The driver circuit of claim 9, including further first circuit means respectively connected between said output means and said source means in order to selectively supply a third of said plurality of reference potentials to said output means, and at least one additional input means respectively connected to said further first circuit means to control the operation thereof, said further first circuit means selectively rendered conductive to form a current path from said source means to said output means to thereby charge said output means with a potential substantially equal to that of said third reference potential.

* * * * *